United States Patent
Schamberger et al.

(10) Patent No.: US 6,717,200 B1
(45) Date of Patent: Apr. 6, 2004

(54) VERTICAL FIELD EFFECT TRANSISTOR WITH INTERNAL ANNULAR GATE AND METHOD OF PRODUCTION

(75) Inventors: Florian Schamberger, Bad Reichenhall (DE); Helmut Schneider, München (DE); Jürgen Lindolf, Friedberg (DE); Thoai-Thai Le, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/408,688

(22) Filed: Sep. 30, 1999

(30) Foreign Application Priority Data

Sep. 30, 1998 (DE) .......................................... 198 45 003

(51) Int. Cl.⁷ ...................... H01L 31/119; H01L 29/76; H01L 29/788; H01L 29/792
(52) U.S. Cl. ...................... 257/302; 257/329; 257/330; 257/331; 257/332; 257/334; 257/336
(58) Field of Search ................... 257/329, 332, 257/334, 336, 330, 331, 302

(56) References Cited

U.S. PATENT DOCUMENTS

| 4,683,643 A |   | 8/1987  | Nakajima et al. |
| 5,122,848 A |   | 6/1992  | Lee et al.      |
| 5,262,336 A | * | 11/1993 | Pike, Jr. et al. ............... 437/31 |
| 5,324,973 A | * | 6/1994  | Sivan .......................... 257/330 |
| 5,424,231 A | * | 6/1995  | Yang ............................ 437/40 |
| 5,444,007 A | * | 8/1995  | Tsuchaiki .................... 437/35 |
| 6,140,679 A | * | 10/2000 | Ferla et al. ................. 257/341 |
| 6,172,390 B1 | * | 1/2001 | Rupp et al. ................. 257/302 |
| 6,180,441 B1 | * | 1/2001 | Yue et al. ................... 438/197 |
| 6,222,753 B1 | * | 4/2001 | Goebel et al. ................ 365/63 |
| 6,284,615 B1 | * | 9/2001 | Pinto et al. ................. 438/336 |

OTHER PUBLICATIONS

Japanese Patent Abstract No. 60136369 (Toshiharu), dated Jul. 19, 1985.
Japanese Patent Abstract No. 03055879 (Kazutoshi), dated Mar. 11, 1991.
"A Surrounding Gate Transistor (SGT) Cell for 64/256Mbit DRAMs", K. Sunochi et al., IEDM 89–23, 2.1.1.

* cited by examiner

Primary Examiner—Long Pham
Assistant Examiner—Shrinivas H Rao
(74) Attorney, Agent, or Firm—Laurence A. Greenberg; Werner H. Stemer; Ralph E. Locher

(57) ABSTRACT

A vertical MOS field effect transistor includes a gate disposed in a trench, a channel, and a source and a drain disposed in the substrate on the trench wall. The gate annularly surrounds a drain terminal which extends from the substrate surface as far as the drain disposed on the trench bottom. It is possible to produce vertical transistors with different channel lengths on a substrate with trenches of different widths by employing oblique implantation when producing the gate. A method of producing the vertical field effect transistor is also provided.

6 Claims, 4 Drawing Sheets

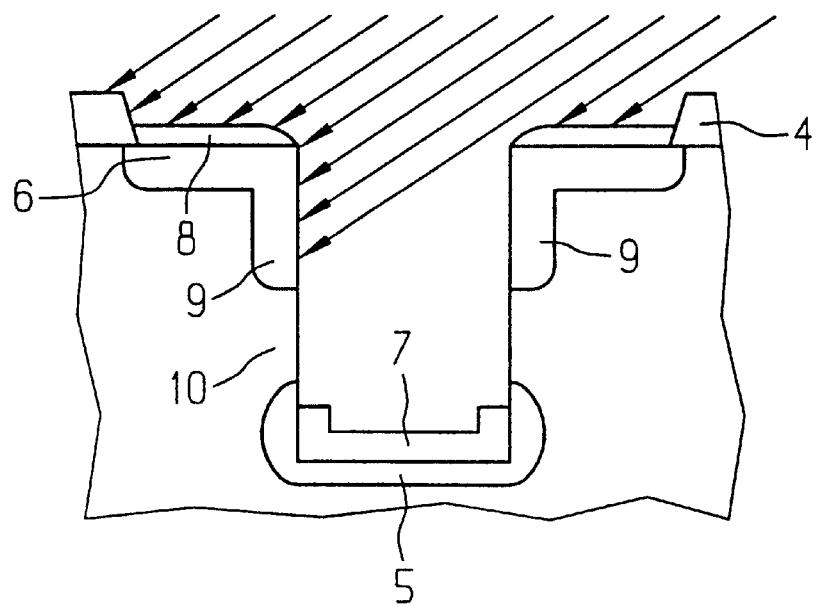
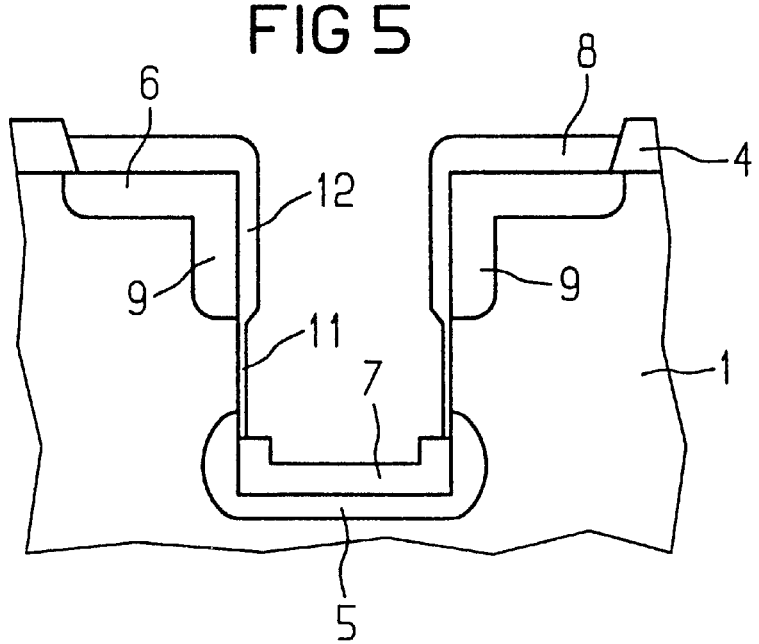

VERTICAL FIELD EFFECT TRANSISTOR WITH INTERNAL ANNULAR GATE AND METHOD OF PRODUCTION

BACKGROUND OF THE INVENTION

Field of the Invention

The invention relates to a vertical MOS filed effect transistor in a semiconductor substrate and a method for producing such a transistor.

The requirement for higher integration density in integrated circuits signifies a reduction in gate length, in particular for field effect transistors. With gate lengths of, for example, 0.5 to 0.2 μm and less, that leads to a sharp increase in short-channel effects, for example:

1) short-channel effect: a stronger influence of space-charge zones of source and drain regions causes a reduction in spatial voltage $U_{th}$;
2) narrow-width effect: a proportion of channel edge regions with a radial space-charge zone, which rises in relation to the channel width, leads to an increase in $U_{th}$; and
3) punch-through effect: an overlap, occurring for relatively small gate lengths, of the space-charge zones running out from the drain and source regions into the channel causes an increasing reduction in a potential barrier in the channel. As a result, there is a drastic rise in leakage currents below a threshold voltage, as well as a poorer on/off current ratio. A gate oxide thickness must be reduced in order to keep a leakage current density low. In turn, that has a negative influence on dielectric strength, service life and current carrying capacity of the transistor.

Vertical field effect transistors are used in order to avoid disadvantageous short-channel effects despite high integration density, that is to say the channel is vertically disposed relative to the substrate surface. That permits longer gate lengths without increasing a horizontal space requirement. One example of such a vertical transistor is a so-called surrounding gate transistor, in which a vertical channel is surrounded on all sides by a gate. Such an SGT transistor is described in an article entitled: A Surrounding Gate Transistor(SGT) Cell for 64/256 Mbit DRAMs, by K. Sunoushi et al. in IEDM 98-23, 2.1.1. In that case, the gate controls all four sides of the channel. A disadvantage of that concept is a low mobility of the charge carriers in the channel, which worsens electric properties of the transistor.

As a rule, in an integrated circuit there is a need for transistors having various electric properties, that is to say it is necessary, for example, to produce transistors having various channel lengths. Known methods of production for such vertical transistors provide the use of an additional mask level for each channel length, and are therefore very expensive.

SUMMARY OF THE INVENTION

It is accordingly an object of the invention to provide a vertical field effect transistor with an internal annular gate and a method of production, which overcome the hereinafore-mentioned disadvantages of the heretofore-known methods and devices of this general type, in which the transistor has improved electric properties and in which the method permits the production of transistors of different channel length without the use of additional mask levels.

With the foregoing and other objects in view there is provided, in accordance with the invention, a vertical MOS transistor, comprising a semiconductor substrate having a surface, a depth and a trench extending from the surface into the depth and defining a trench periphery, a trench interior, a trench bottom and a trench wall with lower, middle and upper regions; a drain region formed by a doped region in the semiconductor substrate adjacent the trench bottom and adjacent the lower region of the trench wall entirely over the trench periphery; a source region formed by a doped region of the semiconductor substrate adjacent the trench wall at the upper region of the trench; a channel region formed by a region of the semiconductor substrate adjacent the trench wall at the middle region of the trench; a gate disposed in the trench interior; an upper insulating layer insulating the gate from the source region; a lower insulating layer insulating the gate from the drain region; a gate dielectric insulating the gate from the channel region; and a drain terminal annularly surrounded by the gate, insulated from the gate and extending from the surface to the drain region.

With the objects of the invention in view there is also provided a method for producing a transistor, which comprises producing a trench in a semiconductor substrate, defining a lower trench region, a trench bottom and a trench wall having an upper region and a lower region; producing a protective layer on the trench wall exposing the trench wall in the lower trench region and the trench bottom; producing a drain region by doping the exposed trench wall and the trench bottom, and removing the protective layer; producing a lower insulating layer on the drain region; producing a source region in the upper region of the trench wall by oblique implantation; producing a gate dielectric on the trench wall, and an upper insulating layer on the source region; producing a gate on the trench wall not filling up the trench; producing an insulation on the gate; and exposing the trench bottom and filling the trench with a conducting layer to form a drain terminal.

In the transistor according to the invention, the source, drain and channel are disposed on the side wall of a trench in a semiconductor substrate. The trench walls are insulated, specifically a gate dielectric is disposed on the middle region of the trench wall, and an upper insulating layer and a lower insulating layer are disposed respectively on the upper and lower region, that is to say on the source and drain regions. The gate is accommodated in the interior of the trench, which has a bag-shaped structure. The drain is constructed annularly around the transistor trench and adjoins the trench bottom. The gate does not fill up the entire trench, but annularly surrounds a drain terminal which reaches from the substrate surface as far as the trench bottom. An insulation is provided between the gate and drain terminal.

The source region is preferably formed from two subregions at opposite points on the trench wall, which are electrically connected to one another in a suitable way. Two subregions of the channel are then correspondingly located on opposite trench walls. In the case of a trench of circular cross section, the channel and source can also annularly surround the entire circumference of the trench.

The upper insulating layer and the lower insulating layer preferably have a greater layer thickness than the gate dielectric, with the result that effective insulation is ensured between the gate and source region or drain region, that is to say the gate capacitance is minimized. A further advantage is that the gate-source capacitance and the gate-drain capacitance are independent of lithography, since those insulating layers are produced in a manner which is self-adjusted relative to the source region and/or drain region.

The low space requirement of the gate electrode ($\geq 1F^2$, wherein F denotes a minimum feature size) permits a high integration density for such transistors. Since the transistor channel is formed of a monocrystalline substrate, such a transistor has good electric properties, such as a long service life, high dielectric strength and high mobility of the charge carriers.

The method of production for the transistor provides for firstly producing the trench with the aid of a mask with the depth required for the transistor and a preselected cross section, and for producing a protective layer on the trench wall which exposes the trench wall in the lower region, that is to say in the vicinity of the bottom of the trench, and exposes the trench bottom. This part of the trench wall, which is exposed and runs around the entire circumference of the transistor trench, and the trench bottom, are then doped with a dopant which has the conductivity type opposite to that of the semiconductor substrate. As a result, a drain region is produced which runs annularly around the lower region of the trench and adjoins the trench bottom. The protective layer serves as a doping mask. A suitable doping method is, in particular, plasma immersion implantation, or deposition doping. A lower insulating layer is produced on the exposed wall and on the trench bottom. The protective layer, or parts thereof still remaining, are removed.

There follows an oblique implantation in the upper region of the exposed trench wall for the purpose of forming a source region. The implantation angle in combination with the width of the trench determines to what trench depth the trench wall is doped, and thus what channel length (non-implanted middle region of the trench wall) remains. If trenches of prescribed depth and different width are produced on the substrate, it is therefore possible to produce transistors of different channel lengths, without the need for a further mask (for example for a further source implantation or channel implantation).

The source implantation can be performed at the same angle in two opposite parts of the trench wall, and the regions thus produced must then be electrically connected in a suitable way. In the case of a trench of circular cross section, an annular continuous source region can be produced by implantation in all sides of the upper trench wall.

It is preferable to implant oxygen in the upper region of the trench wall simultaneously with the source implantation, in which a suitable dopant is implanted. After the oblique implantation, the gate dielectric and the upper insulating layer are produced. A thermal oxidation is preferably carried out. In this case, the implanted oxygen is then also incorporated, with the result that the upper insulating layer is thicker than the gate oxide.

The gate is produced in the interior of the trench, preferably by depositing a doped polysilicon layer which does not fill up the trench, and subsequent anisotropic etching. An insulating layer is formed on a free surface of the gate. The drain region is exposed on the trench bottom, and the trench is filled up with a conducting layer to form the drain terminal.

It is preferred to use a threefold layer as the protective layer which is formed, in particular, of silicon nitride/silicon oxide/silicon nitride, that is applied to the trench wall and to the trench bottom. The upper nitride layer is then etched anisotropically and selectively, the exposed oxide is subsequently isotropically removed and finally, the nitride is etched isotropically and selectively. A nitride/oxide double layer then remains in the upper and middle regions of the trench wall, and the lower wall region and the trench bottom are exposed.

A gate contact is produced on the substrate surface preferably on only one side of the trench by-masking the region of the later gate contact during the spacer etching of the gate so that a (polysilicon) island remains behind in this case.

The source contact of the substrate surface can be produced, for example, by virtue of the fact that during the doping of the drain region a region of the substrate surface adjoining the trench is simultaneously doped. This region is then connected to the actual source region on the trench wall and can be used as an electric terminal. Furthermore, this region can short-circuit two source regions implanted on opposite parts of the trench wall.

The drain terminal is produced by a self-adjusted process management. Its contact area increases with decreasing channel length (that is to say a larger channel width).

Other features which are considered as characteristic for the invention are set forth in the appended claims.

Although the invention is illustrated and described herein as embodied in a vertical field effect transistor with an internal annular gate and a method of production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1–9 are fragmentary, diagrammatic, cross-sectional views taken along a line I/IX—I/IX in FIG. 10, in the direction of the arrows, of a semiconductor substrate on which a production of a transistor is illustrated.

DESCRIPTION OF THE PREFERRED EMBODIMENTS

Figure 1:
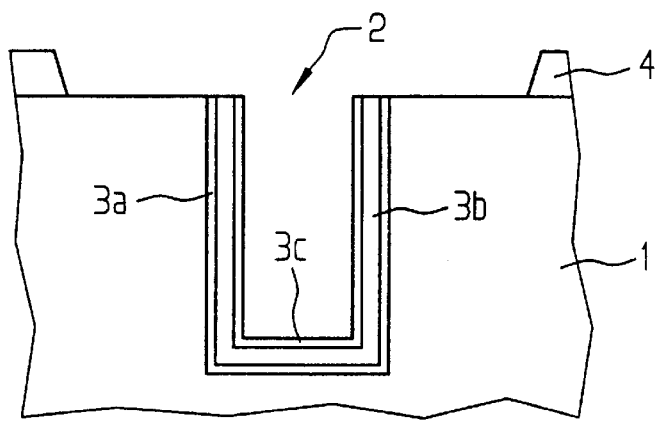

Referring now to the figures of the drawings in detail and first, particularly, to FIG. 1 thereof, there is seen a trench 2 which is etched into an Si semiconductor substrate 1 (p-doped) with the aid of a conventional trench mask. The trench can, for example, have an elongated or rectangular cross section and a diameter or side length which can vary over a wide range ($\geq F$). Various trenches can be produced in the same substrate with the aid of different diameters or side lengths for producing different channel lengths. The depth of the trench can, for example, be in a range of 0.6–1.5 $\mu$m. The trench is clad with a layer sequence formed of silicon nitride $3a$, silicon oxide $3b$ and silicon nitride $3c$, which is produced by conformal deposition. This layer sequence is removed again on the substrate surface, preferably by a CMP (chemical mechanical polishing) step. The layer thicknesses are preferably respectively in a range of 10–80 nm. A further layer 4, in particular an oxide layer with an approximate thickness of 100–400 nm, is then applied to the substrate surface and removed again in the trench and in an area surrounding the trench.

Figure 2:
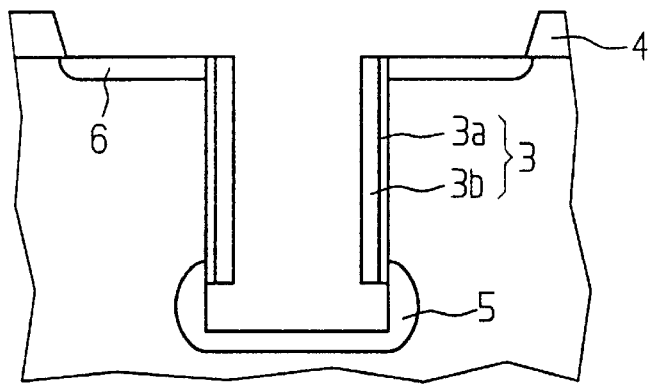

According to FIG. 2, initially the upper nitride layer $3c$ is etched anisotropically and selectively relative to the oxide layer, and subsequently the exposed oxide $3b$ is removed selectively relative to the nitride $3c$ and $3a$ by an isotropic etching process. The oxide layer 4 is also thinned somewhat in this oxide etching process. Finally, isotropic nitride etching is used to remove the top nitride 3c selectively to the oxide 3b on side walls, and to remove the exposed basic nitride 3a on a trench bottom. The result is a protective layer 3 (being formed of the oxide 3b and the basic nitride 3a) which exposes the bottom and the lower region of the trench wall. The vertical extent of the exposed trench wall corresponds approximately to the layer thickness of the protective layer or the initial threefold layer. The protective layer 3 serves as a mask for doping a drain. It is preferable to use a plasma immersion implantation with ions of an n-conducting dopant. As a result, a drain region 5 is formed on the trench bottom and in a lower region of the trench wall. Overall, the drain region surrounds the lower trench region. At the same time, an n-doped region 6, which can later be used as a terminal for a source region, is produced next to the trench on the substrate surface. The size of this doped region 6 is defined by an opening in the further layer 4.

Figure 3:
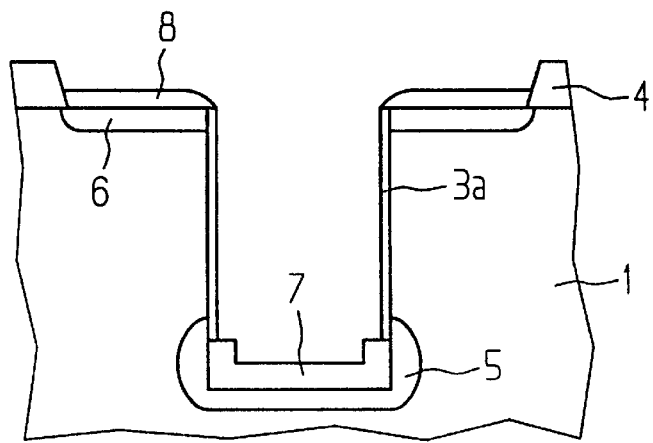

FIG. 3 shows that the oxide layer 3b which is still present on the trench wall is removed, and then a thermal oxidation is carried out. In this case, a lower insulating layer 7 which covers the trench wall and the trench bottom is formed in the lower region of the trench. The lower insulating layer 7 has a thickness which is, for example, in a range of 30–100 nm. At the same time, an oxide 8 is formed on the doped region 6 on the substrate surface. No oxide is formed on the wall in upper and middle trench regions, since in this case the nitride layer 3a acts as an oxidation mask.

According to FIG. 4, the remaining nitride layer 3a is now removed. An implantation with n-doping ions is carried out in an upper region of the trench wall. Two opposite parts (sides) of the trench wall are implanted down to the same trench depth. A vertical extent of a source region 9 (that is formed in this case of two subregions) which is thus produced is prescribed in this case by an implantation angle and a trench width. Thus, for trenches of different widths, the respective source regions reach different depths into the trench, with the result that a remaining middle region 10 of the trench wall, which has the doping of the substrate and forms the channel region of the transistor, varies in length (vertically relative to the substrate surface). Consequently, various channel lengths 10 can be produced with a single oblique implantation (possibly in opposite trench walls). Oxygen which is incorporated into the trench wall can be implanted simultaneously with the dopant, that is to say with the same implantation angle. Its implantation energy is selected in such a way that it remains in the vicinity of the wall surface.

FIG. 5 shows a gate oxide 11 which is produced in a middle region of the trench wall by an oxidation step, and an upper insulating layer 12 that is produced in the process in the upper region of the trench wall. Due to the incorporation of the implanted oxygen, the upper insulating layer is thicker than the gate oxide. The oxide 8 disposed on the doped region 6 is also thickened depending on process conditions.

Figure 6:
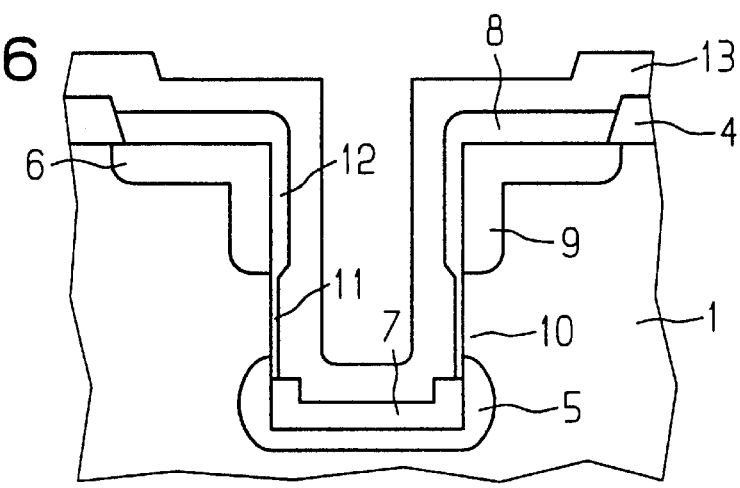

According to FIG. 6, a conducting layer 13 which is suitable as gate material, in particular a doped polysilicon, is then applied over the entire surface as the gate material. The layer thickness is selected in such a way that the trench is not filled up.

Figure 7:
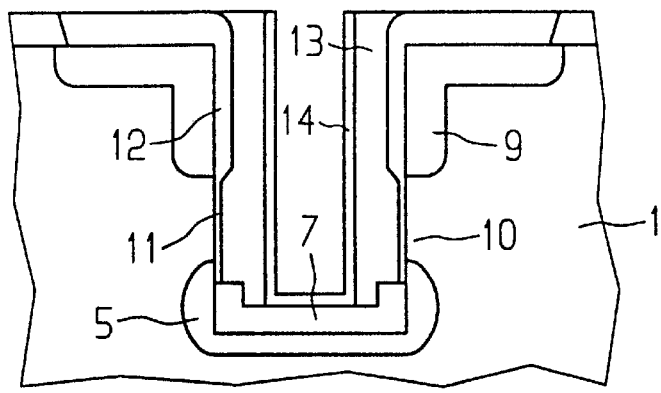

FIG. 7 shows that the polysilicon 13 is anisotropically etched, with the result that the lower insulating layer 7 is exposed on the trench bottom, and the layer 13 remains on the trench wall in the form of an annular polysilicon spacer. This spacer 13 forms the gate. During the spacer etching, a part of the trench and an adjacent region of the substrate surface are preferably covered with a mask, with the result that the polysilicon 13 likewise remains in this case and can serve as a terminal for the gate (outside the plane of the drawing in FIG. 7). A nitride layer 14 is subsequently deposited over the entire surface as insulation on the gate 13. This nitride on the substrate surface is removed again, for example through the use of CMP. To this end, it is possible to use CMP, for example, when the gate terminal has previously been produced in a recessed manner.

Figure 8:
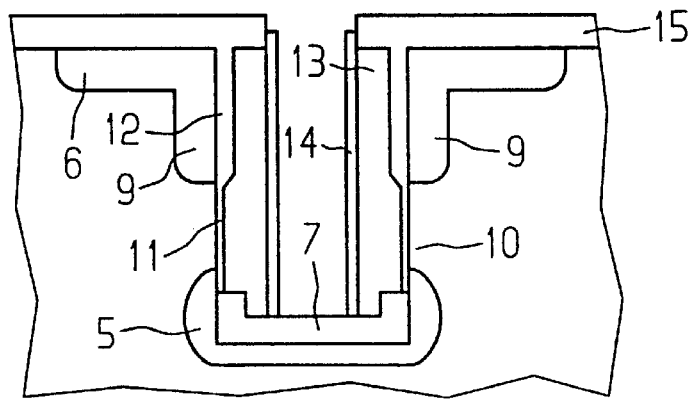

According to FIG. 8, the entire configuration is subjected to an oxidation step in which an oxide 15 that is thicker than the lower insulating layer 7 is formed on the substrate surface. The nitride 14 acts as an oxidation mask. Subsequently, the nitride is anisotropically etched, with the result that the lower insulating layer 7 is exposed on the trench bottom.

Figure 9:
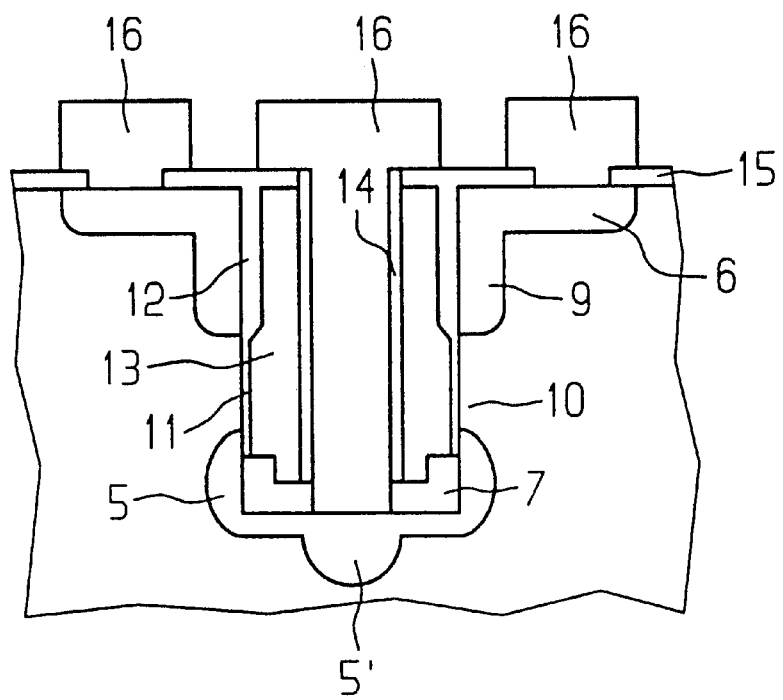
Figure 10:
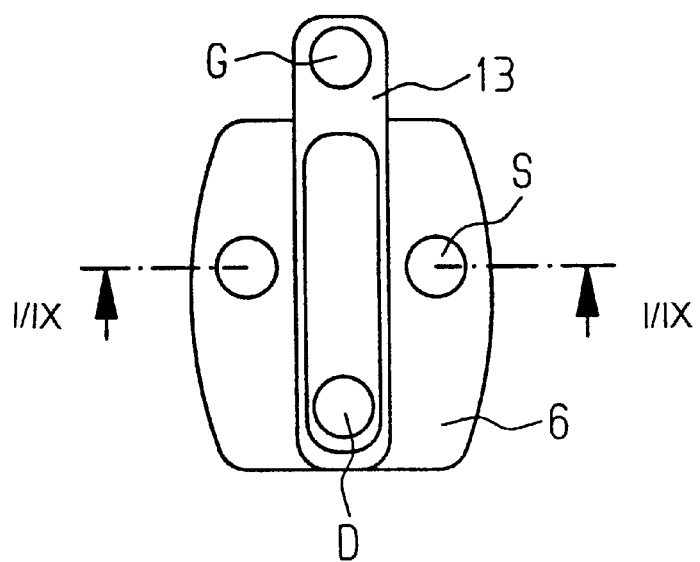
FIG. 10 is a plan view of the substrate.

FIG. 9 shows that anisotropic oxide etching is carried out, preferably over the entire area, until a part of the drain region 5 is exposed on the trench bottom. A residual thickness of the oxide layer 15 still remains on the substrate surface. Vias or contact holes are etched into this oxide layer for a terminal of the source region through the doped region 6, and for a gate terminal, as is seen in FIG. 10. It is possible to undertake contact implantations to reduce the contact resistance in the vias or contact holes, and this also forms an illustrated region 5'. Finally, a conducting layer 16, for example a suitable metal, is applied, with which the contacts to the source, drain and gate are produced.

FIG. 10 illustrates the position of the doped region 6, the polysilicon 13 and terminals S, D and G provided for the source, drain and gate in a diagrammatic plan view of the substrate surface. FIG. 10 also shows a section line I/IX—I/IX for FIGS. 1–9.

We claim:

1. A vertical MOS transistor, comprising:

a semiconductor substrate having a surface, a depth and a trench extending from said surface into said depth and defining a trench periphery, a trench width, a trench interior, a trench bottom and a trench wall with lower, middle and upper regions, said depth being in a range between approximately 0.6 $\mu$m and approximately 1.5 $\mu$m from said surface;

a drain region being a doped region in said semiconductor substrate adjacent said trench bottom and adjacent said lower region of said trench wall entirely over said trench periphery;

a source region obliquely implanted by a dopant and oxygen and being a doped region of said semiconductor substrate adjacent said trench wall at said upper region of said trench;

a channel region being a region of said semiconductor substrate adjacent said trench wall at said middle region of said trench;

a gate disposed in said trench interior;

an upper insulating layer insulating said gate from said source region, said upper insulating layer having a given thickness;

a lower insulating layer insulating said gate from said drain region, said lower insulating layer having a thickness in a range between approximately 30 nm and approximately 100 nm;

a gate dielectric insulating said gate from said channel region, said gate dielectric having a thickness less than said given thickness of said upper insulating layer;

a drain terminal annularly surrounded by said gate, insulated from said gate and extending from said surface to said drain region; and said source region having a variable depth reaching into said trench dependent upon said trench width, resulting in said middle region of said trench wall, which forms said channel region, varying in length vertically with respect to said surface of said substrate.

2. The transistor according to claim 1, wherein said upper insulating layer, said lower insulating layer and said gate dielectric are formed of thermal silicon oxide.

3. The transistor according to claim 1, including a silicon nitride layer insulating said drain terminal from said gate.

4. The transistor according to claim 1, including a doped region connected to said source region and connecting said source region to said substrate surface.

5. The transistor according to claim 1, wherein said source region has two subregions at opposite locations on said trench wall, said subregions conductively connected to one another.

6. The transistor according to claim 1, wherein said trench has a circular cross section, and said source region and said channel region annularly surround said trench.

* * * * *